US012689007B2

(12) United States Patent
Hosokawa et al.

(10) Patent No.: US 12,689,007 B2
(45) Date of Patent: Jul. 21, 2026

(54) STRUCTURAL MEMBER

(71) Applicant: TOTO LTD., Fukuoka (JP)

(72) Inventors: Morio Hosokawa, Fukuoka (JP);
Tatsuya Koga, Fukuoka (JP)

(73) Assignee: TOTO LTD., Fukuoka (JP)

( * ) Notice: Subject to any disclaimer, the term of this
patent is extended or adjusted under 35
U.S.C. 154(b) by 0 days.

(21) Appl. No.: 19/079,024

(22) Filed: Mar. 13, 2025

(65) Prior Publication Data

US 2025/0308856 A1 Oct. 2, 2025

(30) Foreign Application Priority Data

Mar. 28, 2024 (JP) ................................. 2024-052887
Jan. 29, 2025 (JP) ................................. 2025-013266

(51) Int. Cl.
*H01J 37/32* (2006.01)

(52) U.S. Cl.
CPC .. *H01J 37/32495* (2013.01); *H01J 37/32467*
(2013.01); *H01J 2237/0213* (2013.01)

(58) Field of Classification Search
CPC ........... H01J 37/32495; H01J 37/32467; H01J
2237/0213
See application file for complete search history.

(56) References Cited

U.S. PATENT DOCUMENTS

| | | | |
|---|---|---|---|
| 2008/0276865 A1 | 11/2008 | Nishimizu et al. | |
| 2018/0301321 A1 | 10/2018 | Iwasawa | |
| 2020/0270179 A1 | 8/2020 | Yoshida et al. | |
| 2020/0402773 A1* | 12/2020 | Ishikawa | C23C 14/083 |

FOREIGN PATENT DOCUMENTS

| | | |
|---|---|---|
| JP | 2005158933 A | 6/2005 |
| JP | 2008160097 A | 7/2008 |
| JP | 2013134946 A | 7/2013 |
| JP | 2017114724 A | 6/2017 |
| JP | 2020050536 A | 4/2020 |
| JP | 2021068887 A | 4/2021 |
| JP | 2022141174 A | 9/2022 |
| WO | 2019069939 A1 | 4/2019 |
| WO | 2019160122 A1 | 8/2019 |
| WO | 2022250097 A1 | 12/2022 |

* cited by examiner

*Primary Examiner* — Henry Luong
(74) *Attorney, Agent, or Firm* — Seed Intellectual
Property Law Group LLP

(57) ABSTRACT

A structural member 10 has a base material 100 and a
protective film 200 covering the surface S1 of the base
material 100. When a section obtained by cutting the base
material 100 perpendicularly to the surface S1 thereof is
defined as a cross-section, a shape of a line corresponding to
the surface S1 of the base material 100 in the cross-section
is defined as a surface shape, and Fourier transformation is
performed on a function representing the surface shape, and
the transformed function is drawn as a graph with wave-
length (μm) on a horizontal axis, an average slope of the
graph in a range where the wavelength is 30 μm or less is
0.0050 or less.

5 Claims, 10 Drawing Sheets

Fig. 3

| No | Ra [$\mu$ m] | Average slope | Particle proof |
|----|--------------|---------------|----------------|
| 1  | 0.10         | 0.0046        | ◯              |
| 2  | 0.44         | 0.0042        | ◯              |
| 3  | 0.57         | 0.0087        | ✕              |

No.1

No.2

No.3

Wavelength (μm)

STRUCTURAL MEMBER

CROSS-REFERENCE TO RELATED APPLICATION

This application is based upon and claims the benefit of priority from Japanese Patent Application No. 2024-052887 filed on Mar. 28, 2024, and Japanese Patent Application No. 2025-013266 filed on Jan. 29, 2025, the entire contents of which are incorporated herein by reference.

FIELD

The present invention relates to a structural member.

BACKGROUND

Structural members having a protective film on the surface of a base material are used in various fields such as semiconductor manufacturing equipment. For example, in a plasma etching system, a protective film is formed on the surface of a base material constructing an inner wall of a chamber for protecting the base material from plasma. For such a protective film, for example, oxide ceramics such as yttrium oxide (yttria) are used.

When the protective film is exposed to plasma, a part of the deteriorated protective film sputters in the form of large particles, likely affecting semiconductor manufacturing process. The protective film less likely causing such a phenomenon is notated hereinbelow as the "protective film with excellent particle proof." For example, a protective film less likely causing the deterioration when exposed to plasma and a protective film that sputters when deteriorated in the form of fine particles to the extent of being not a problem in the process (that is, a protective film less likely forming large particles) are both considered the "protective film with excellent particle proof".

The method adaptable for forming the protective film on the surface of a base material includes, for example, various film formation methods such as PVD and CVD. In recent years, the film formation by the aerosol deposition method has been increasingly practiced. Several film formation methods including the aerosol deposition method have achieved the formation of dense protective films composed of fine crystal grains with excellent particle proof. The formation of a dense protective film with excellent particle proof requires longer film formation time than a conventional production method, however, such a protective film can obtain a certain lifespan even when a thickness is comparatively thin. Thus, the study on comparatively thinning the thickness of protective films has been conducted. When the film thickness is thin, the shape of the protective film surface is more strongly affected by the surface shape of a base material.

SUMMARY

For preventing the occurrence of particles, removal of unevenness on the protective film surface to reduce an arithmetic average roughness Ra and the like has been practiced. Additionally, for preventing the protective film from peeling and obtaining a dense protective film, it has been considered that the surface of a base material on which a protective film is formed needs to be a smooth surface having an arithmetic average roughness Ra of about 0.1 μm or less.

The present inventors have found that a structural member with excellent particle proof can be obtained by controlling the parameter of plane direction, instead of the arithmetic average roughness Ra, which is the parameter of height direction, on the surface of a base material on which the protective film is formed. An object of the present invention is to provide a structural member having a protective film with excellent particle proof.

For solving the above problem, the structural member according to the present invention has a base material and a protective film covering the surface of the base material. When a section obtained by cutting the base material perpendicularly to the surface thereof is defined as a cross-section, a shape of a line corresponding to the surface of the base material in the cross-section is defined as a surface shape, and Fourier transformation is performed on a function representing the surface shape, and the transformed function is drawn as a graph with wavelength (μm) on a horizontal axis, an average slope of the graph in a range where the wavelength is 30 μm or less is 0.0050 or less.

According to the experiment conducted by the present inventors, a novel finding has been obtained that when the surface of the base material in the structural member has comparatively few fine unevenness and an average slope of the graph is 0.0050 or less, the particle proof increases. In other words, when an average slope of the graph is 0.0050 or less, the structural member having the protective film with excellent particle proof can be obtained even when the surface of the base material has a roughness with an arithmetic average roughness Ra of more than 0.15 μm.

According to the present invention, the structural member having a protective film with excellent particle proof can be provided.

BRIEF DESCRIPTION OF THE DRAWINGS

FIG. 3 shows the results of a film formation test;

DETAILED DESCRIPTION

Figure 1:
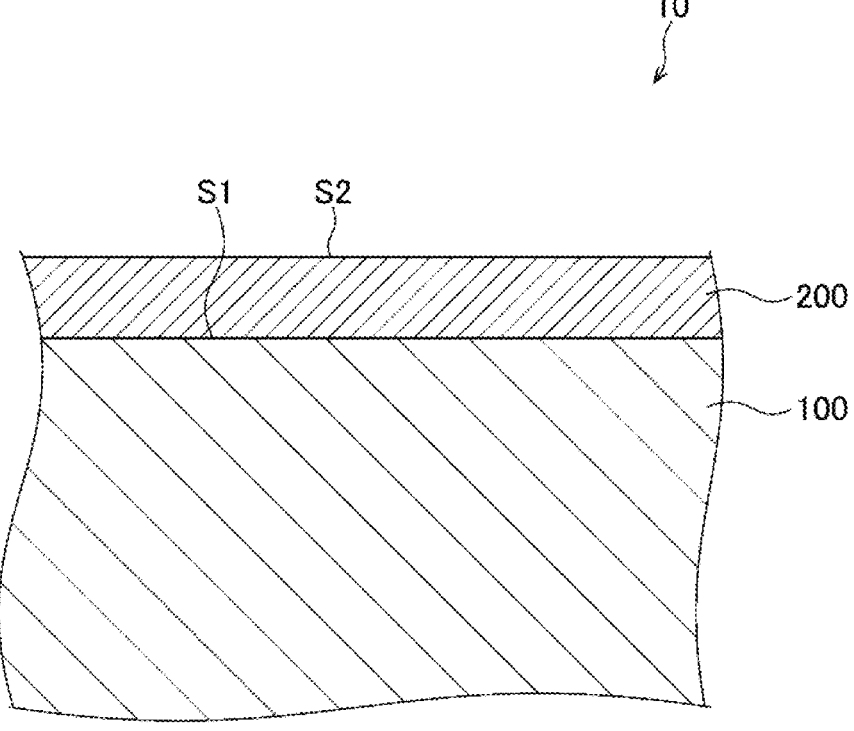
FIG. 1 schematically shows a cross-section of the structural member according to the present embodiment.

Hereinafter, the present embodiments will be described in reference to the attached drawings. For easier understanding of the descriptions, in the drawings, the same elements are denoted by the same reference characters as much as possible, and a repeated description thereof may be omitted.

The structural member 10 according to the present embodiment is used as, for example, the member constructing an inner wall of a processing chamber in a semiconductor manufacturing equipment (not shown in the figures) such as a plasma etching system. Such an application of the structural member 10 is only an example and is not limited to the semiconductor manufacturing equipment.

As shown in FIG. 1, the structural member 10 has a base material 100 and a protective film 200. In a plasma etching system and the like, the surface S2 of the protective film 200 is exposed toward the space in a chamber. The protective film 200 is provided for the purpose of protecting the surface S1 of the base material 100 from plasma.

The base material 100 is a member accounting for the majority of the structural member 10. In the present embodiment, the base material 100 is a ceramic sintered body containing a high purity aluminum oxide ($Al_2O_3$) but can also be formed of different types of ceramics from this. Alternatively, the base material 100 can also be formed of a material other than ceramics. The surface S1 of the base material 100 is a flat surface in the present embodiment, but the surface S1 can have a through-hole, an inclined plane, or the like.

The protective film 200 is, as described above, the film formed to protect the base material 100 from plasma. The protective film 200 is formed in such a way as to cover throughout the entire surface S1 of the base material 100. In the present embodiment, the protective film 200 is constructed as a film containing a polycrystalline yttrium oxide (yttria: $Y_2O_3$), but can be a ceramics film composed of a different material. The thickness of the protective film 200 is suitably determined depending on the length of a period required to maintain the durability. In the present embodiment, the thickness of the protective film 200 is about 10 μm as an example, but can also be thinner.

The protective film 200 of the present embodiment is formed on the surface S1 of the base material 100 after firing, by the PVD method or the aerosol deposition method.

When an arithmetic surface roughness Ra of the surface S1 of the base material 100 is too high, it is known that the protective film 200 cannot be formed or the protective film peels. For this reason, it is considered that the surface S1 needs to be a smooth surface in advance of the film formation. Conventionally, the surface S1 was polished and the like so that the surface S1 is a smooth surface having an arithmetic average roughness Ra of 0.1 μm or less. For polishing the surface S1 to achieve a smooth surface as described above, time and efforts are often required. Particularly, when the thickness of the protective film is comparatively thin, the surface shape of the protective film is strongly affected by the surface shape of the base material, due to which it has been considered necessary to tightly manage the surface shape of the base material.

The present inventors have continued experiments and studies on the conditions satisfied by the shape of the surface S1 for forming the protective film 200. As a result, the inventors have obtained a novel finding that a structural member with excellent particle proof can be obtained by controlling the parameter of plane direction, instead of the arithmetic average roughness Ra, which is the parameter of height direction, of the surface S1 of the base material 100.

Figure 2A:
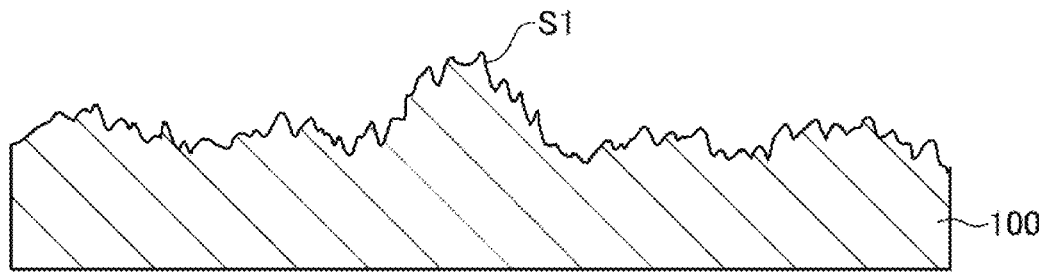
FIG. 2A illustrates the surface shape of a base material.
Figure 2B:
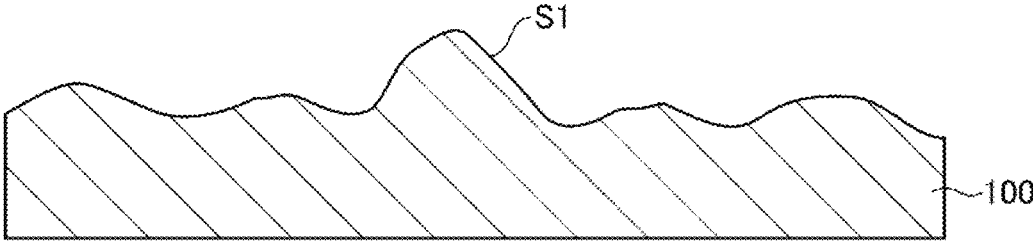
FIG. 2B illustrates the surface shape of a base material.

FIG. 2A and FIG. 2B schematically show cross-sections of the base material 100 before the film formation. The "cross-section" referred to herein means the cross-section when the base material 100 is cut along with the plane perpendicular to the surface S1. In the cross-sections shown in FIG. 2A and FIG. 2B, the shape of the surface S1 of the base material 100 appears as a shape of a line corresponding to the surface S1. Such a shape is hereinafter also referred to as the "surface shape."

The roughnesses of the surface S1 shown respectively in FIG. 2A and FIG. 2B are both approximately the same with each other in terms of the arithmetic average roughness Ra, which are specifically about Ra 0.40 μm. However, the surface S1 in FIG. 2B has fewer fine unevenness than the example in FIG. 2A. Such a difference in the shape does not appear as the difference in the arithmetic average roughness Ra, which is the parameter of height direction. For this reason, 2 of the surfaces S1 respectively shown in FIG. 2A and FIG. 2B are both planes having Ra of 0.40 μm as described above despite the different shapes thereof from each other. On the other hand, the surface shapes of FIG. 2A and FIG. 2B are distinguishable by using the parameter of plane direction.

The present inventors proposed a novel parameter regarding the plane direction for defining the surface S1 of the surface shape having few fine unevenness as in FIG. 2B as an alternative to the conventional parameter, which is the "arithmetic average roughness Ra≤0.1 μm of the surface S1."

The parameter will be described. First, regarding the surface shape of the surface S1 of the base material that appears in the cross-section of the structural member on which the protective film is formed, a function representing such a surface shape is set. The function is represented in the formula of y=f(x) when, for example, the position of left-right direction in FIG. 2A and FIG. 2B is x (μm) and the position of up-down direction in the same figures is y (μm).

Subsequently, Fourier transformation is performed on the function thereby to transform to the form of Y=F(λ). The "λ" in the formula is the parameter representing the wavelength of respective waves in the unit of [μm] when the surface shapes as in FIG. 2A and FIG. 2B are considered as several superposed waves having different wavelengths from each other.

For performing the transformation, x (μm) in the formula of y=f(x) is considered as the parameter of "time" as it is and Fourier transformation is performed thereby to transform to the form of Y1=F1(ω) representing the frequency response. The "ω" represents the frequency. Then, the respective frequencies are converted to wavelengths, thereby enabling the transformation to the form of Y=F(λ).

Figure 5:
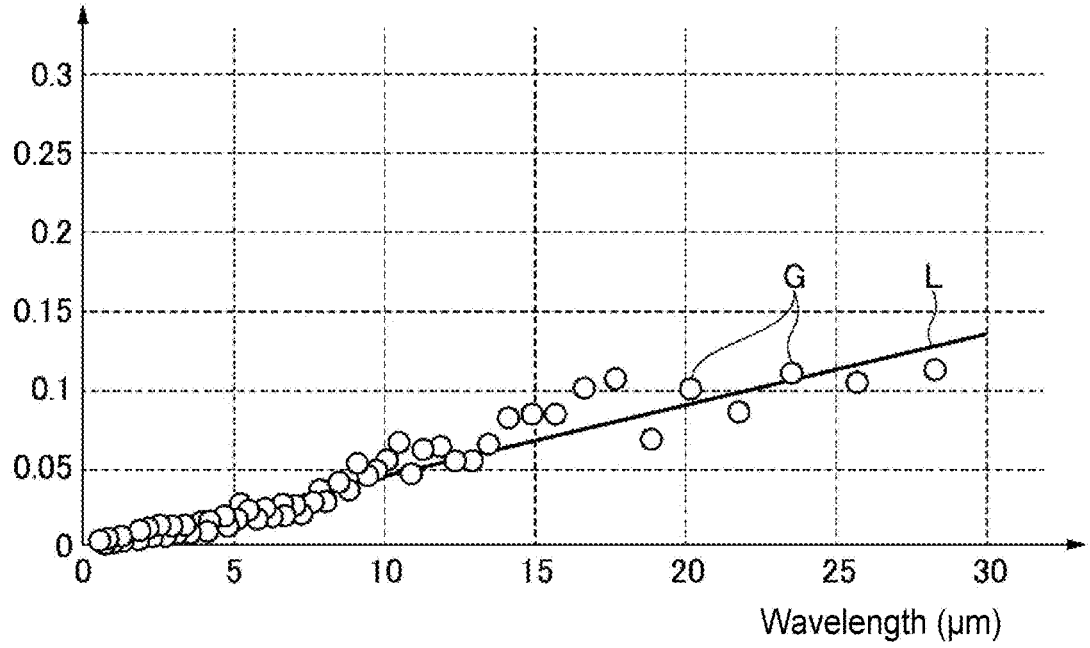
FIG. 5 shows a graph of the Fourier-transformed function calculated from the surface of FIG. 4.

The function representing the surface shape of the surface S1, when transformed to the form of Y=F(λ) as described above and then the transformed function is drawn as a graph, looks like, for example, G of FIG. 5. The horizontal axis of the graph is the "λ" described above, in other words, the wavelength (unit: μm), and the vertical axis is the "Y" described above, in other words, the parameter representing the intensity of respective wavelength components. In G of FIG. 5, the Y=F(λ) graph is drawn as a scatter plot but can also be drawn as a continuous curve.

The L shown in FIG. 5 is a linear trendline of G in a range where the wavelength is 30 μm or less. The slope of L can be said as the average slope of the graph representing Y=F(λ) in a range where the wavelength is 30 μm or less. In the example of FIG. 5, the slope of L is 0.0046.

As in the example of FIG. 2A, when the surface shape of the surface S1 of the base material in the structural member has many fine unevenness, the slope of L described above is calculated as a large value. As in the example of FIG. 2B, when the surface shape of the surface S1 has few fine unevenness, the slope of L described above is calculated as a small value. Considering this, the present inventors have continued the study on the use of such a slope of L as a novel parameter for evaluating the particle proof. As a result, a finding was obtained that when the surface S1 has the slope of L of 0.0050 or less, the structural member with high particle proof can be obtained.

The present inventors made 3 samples of the base material 100 having different surface S1 shapes from each other and prepared structural members having the protective films 200 formed on the surface S1, respectively. The base material 100 was an alumina base material, and the protective film was a yttria film. In this example, the protective films were formed by the aerosol deposition method. At the fracture surface of the structural member, the respective surfaces S1 were calculated for the slope of L. Additionally, the respective surfaces S1 were calculated for the slope of L before the film formation, but in the present test, the surface shapes (slope of L) of the base materials in the structural members (after the protective film formation) were approximately the same as the surface shapes (slope of L) of the base materials before the film formation.

The slope of L of the surface S1 of the base material in the structural members was calculated by the following method. A predetermined range of the surface S1 of the base material to be measured was captured using a laser microscope. The laser microscope used was KEYENCE VK-X3000. The objective lens used was of ×50 magnification, and images at ×1000 magnification were obtained, respectively.

Subsequently, the profile data (data showing the surface shape of the surface S1) were extracted from the above images to obtain the surface shape in the range of a certain length by sampling. The "a certain length" here was 0.2826 mm, and in this range the sampling was carried out at 1024 spots at regular intervals. Subsequently, as mentioned earlier, on the shape obtained by the sampling, Fourier transformation was performed on the function (y=f(x)) representing such a shape to transform to the form of Y=F(λ), and the transformed function was drawn as a graph with the λ on a horizontal axis. Subsequently, the average slope of this graph in a range where the wavelength was 30 μm or less was calculated.

For performing Fourier transformation described above, the function representing the surface shape (y=f(x)) and the transformed function (Y=F(λ)) do not need to be explicitly calculated. That is, the average slope of the Fourier-transformed graph can be calculated by directly performing an arithmetic processing by using a software on the data obtained by the sampling.

In the above test, the arithmetic average roughness Ra of the surface S1 at the fracture surface of each sample was also measured. The arithmetic average roughness Ra was calculated using the profile data of the above image captured using a laser microscope. The "sampling length" referring the measurement range was set to 250 μm. Additionally, the cut-off λs was set to 0.8 μm to calculate in the stylus mode. At that time, the stylus tip radius was set to 2 μm, and the stylus tip angle was set to 60°. The measurement was respectively carried out at 20 spots different from each other on the surface S1, and the obtained values were averaged, thereby calculating the arithmetic average roughness Ra.

Figure 4:
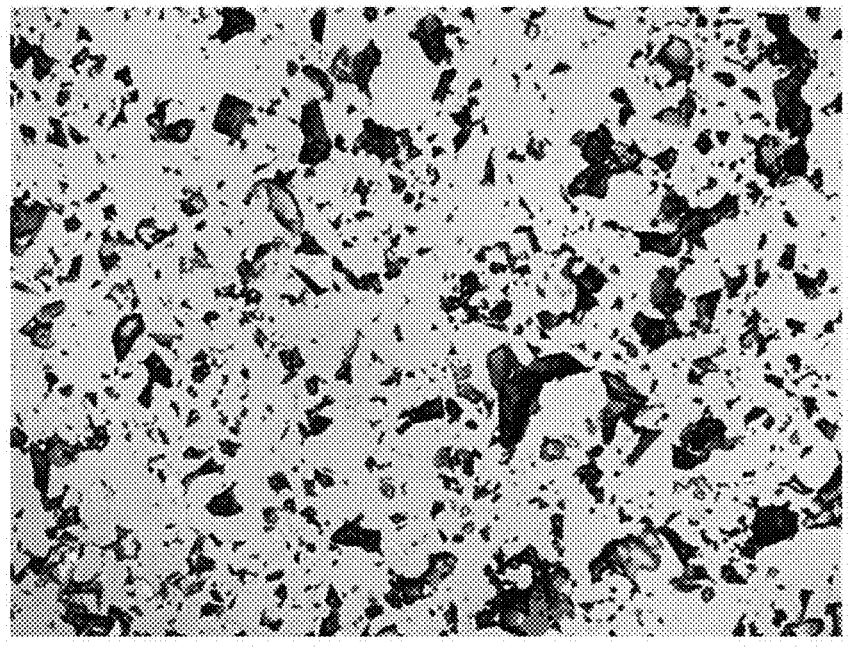
FIG. 4 is an image obtained by capturing the surface of the base material using a laser microscope.

FIG. 3 shows the evaluation results. In the sample of No. 1, the surface S1 was subjected to surface grinding processing before the film formation and then was further subjected to LAP polishing. FIG. 4 shows the image obtained by capturing the surface S1 of the sample of No. 1 using a laser microscope. FIG. 5 shows the graph of Fourier-transformed function calculated on the surface S1 of the sample of No. 1 and the linear trendline (L) of the graph in a range where the wavelength is 30 μm or less. The "average slope" calculated on the surface S1 of the sample of No. 1, in other words, the slope of the linear trendline (L) shown in FIG. 5, was 0.0046. Additionally, the arithmetic average roughness Ra of the same surface was 0.10 μm.

Figure 6:
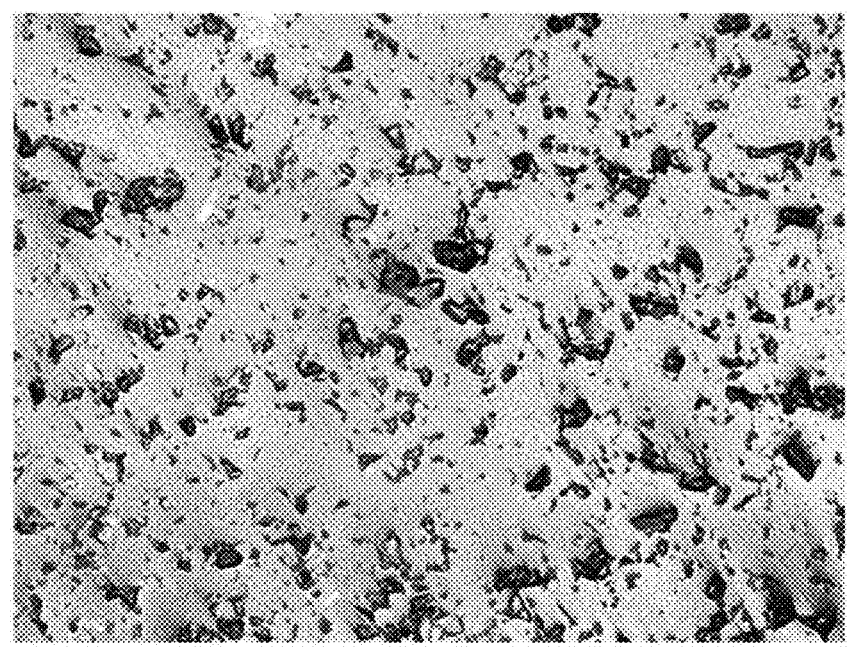
FIG. 6 is an image obtained by capturing the surface of the base material using a laser microscope.
Figure 7:
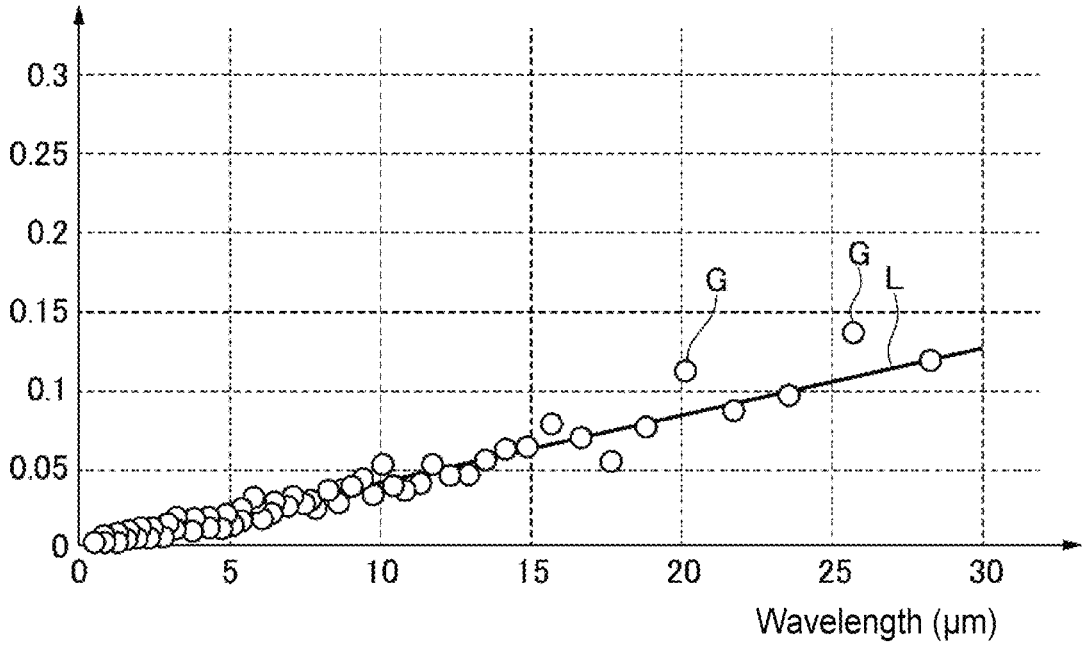
FIG. 7 shows a graph of the Fourier-transformed function calculated from the surface of FIG. 5.

In the sample of No. 2, the surface S1 was subjected to surface grinding processing before the film formation and then was subjected to loose abrasive processing using finer abrasive grains to the extent of not removing the grinding waviness. FIG. 6 shows the image obtained by capturing the surface S1 of the sample of No. 2 using a laser microscope. FIG. 7 shows the graph (G) of Fourier-transformed function calculated on the surface S1 of the sample of No. 2 and the linear trendline (L) of the graph in a range where the wavelength is 30 μm or less. The "average slope" calculated on the surface S1 of the sample of No. 2, in other words, the slope of the linear trendline (L) shown in FIG. 7, was 0.0042. Additionally, the arithmetic average roughness Ra of the same surface was 0.44 μm.

Figure 8:
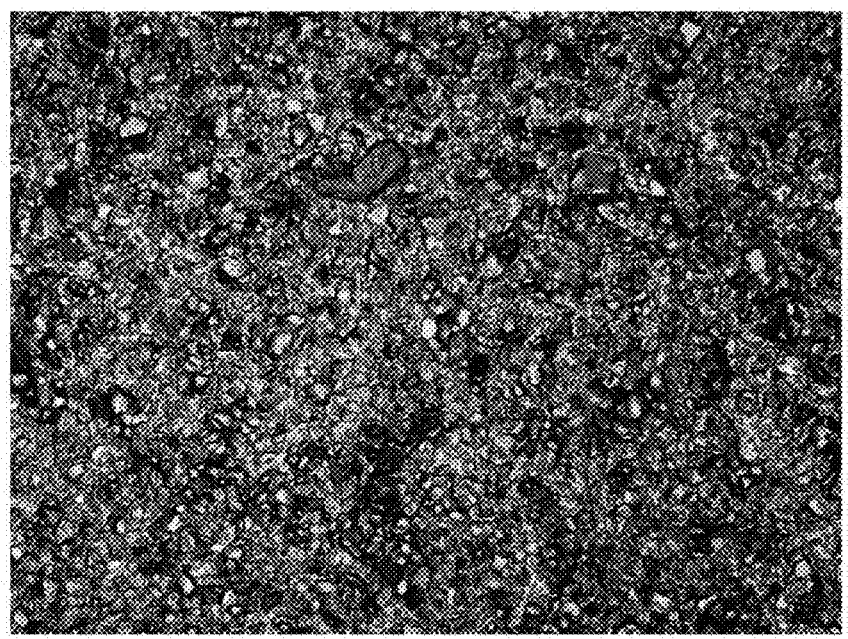
FIG. 8 shows an image obtained by capturing the surface of the base material using a laser microscope.
Figure 9:
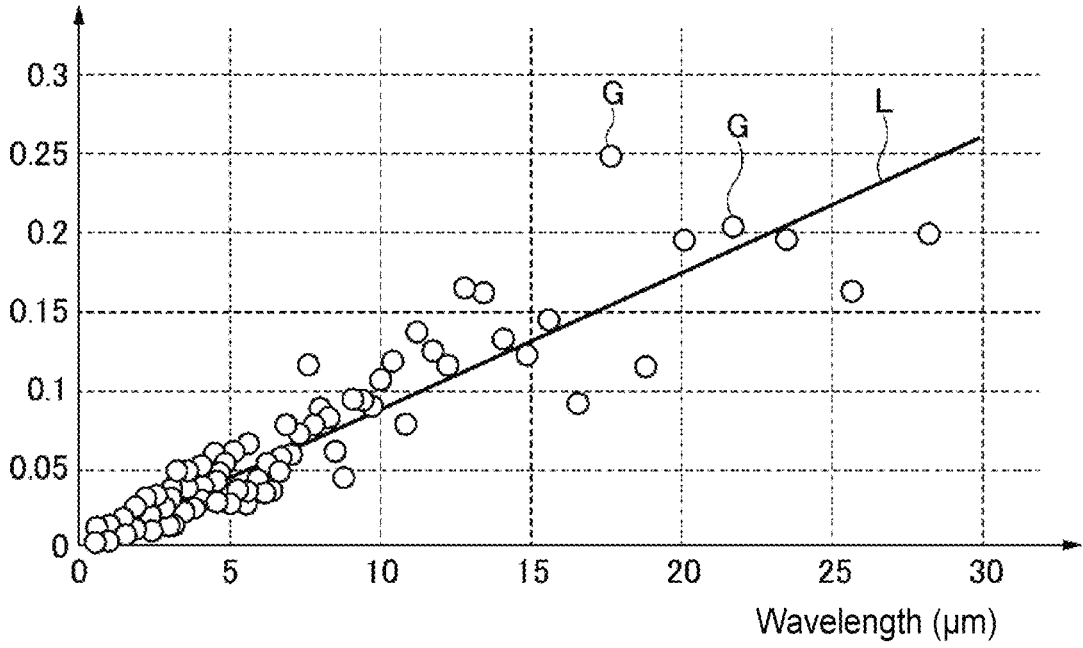
FIG. 9 shows a graph of the Fourier-transformed function calculated from the surface of FIG. 8.

In the sample of No. 3, the surface S1 was subjected only to surface grinding processing before the film formation. FIG. 8 shows the image obtained by capturing the surface S1 of the base material of the sample of No. 3 using a laser microscope. FIG. 9 shows the graph (G) of Fourier-transformed function calculated on the surface S1 of the sample of No. 3 and the linear trendline (L) of the graph in a range where the wavelength is 30 μm or less. The "average slope" calculated on the surface S1 of the sample of No. 3, in other words, the slope of the linear trendline (L) shown in FIG. 9, was 0.0087. Additionally, the arithmetic average roughness Ra of the same surface was 0.57 μm.

As shown in FIG. 3, both samples of No. 2 and No. 3 have the roughnesses of more than 0.1 μm in terms of the arithmetic average roughness Ra, which is the parameter of height direction.

In the sample of No. 2, the slope of L calculated on the surface S1 was as small as 0.0050 or less, with fewer fine unevenness as in the example of FIG. 2A. In contrast, in the sample of No. 3, the slope of L calculated on the surface S1 was as large as more than 0.0050, with the presence of many fine unevenness as in the example of FIG. 2A, whereby the structural member of No. 3 had the poorer result than No. 1 and No. 2. On the other hand, no significant difference was found between the particle proof of the sample of No. 1 having the arithmetic average height Ra of as low as about 0.1 μm and the particle proof of the sample of No. 2 having the arithmetic average height of as high as more than about 0.1 μm.

Thus, it was verified that even when the sample with the surface S1 having an arithmetic average roughness Ra of more than 0.1 μm, high particle proof in the structural member can be achieved as long as the slope of L calculated on the surface S1 is sufficiently small. An experiment separately conducted by the present inventors verifies that when the slope of L calculated on the surface S1 is 0.0050 or less, the particle proof becomes satisfactory.

As the processing method for achieving the roughness of the surface S1 such that the slope of L is 0.0050 or less, various known methods can be adopted. Examples include grindstone polishing, lapping polishing, buff polishing, barrel polishing, electropolishing, and sandblast polishing. When the kind and size of an abrasive used for polishing are suitably selected and the polishing time is adjusted, a slope of L to be calculated can be 0.0050 or less before the arithmetic average roughness Ra of the surface S1 reaches 0.1 μm or less. This also enables to simplify the surface treatment of the base material 100 before the film formation compared to a case where the process is carried out until the arithmetic average roughness Ra of the surface S1 reaches 0.1 μm or less, thereby enhancing the productivity.

The surface S1 may have a slope of L to be calculated of 0.0046 or less. Furthermore, the surface S1 may have a slope of L to be calculated of 0.0042 or less.

Even when the surface S1 of the base material 100 is not a flat surface and is a non-flat surface, for example, a curved surface, the function representing the surface shape of the surface S1 may be transformed to the form of $Y=F(\lambda)$, or the slope of the graph after transformation may be calculated, for example. When the surface S1 is a non-flat surface, the slope of L can be calculated by, for example, a method as described below.

First, a part of the base material 100 is cut out to prepare a plate-like sample including the surface S1 which is a non-flat surface. This sample may be prepared, for example, so as to have the surface S1 throughout its principal surface and have a size of 20 mm×20 mm. A part of the base material 100 is cut out as such a small piece of a sample, whereby the surface S1 to be measured can be rendered flatter and, for example, surface observation under a laser microscope can be easily performed.

If the cut out surface S1 can be roughly regarded as a flat surface, the size of the sample may be different from the size described above. For example, when the surface S1 of the base material 100 has a curved shape, and the radius of curvature of which is relatively large, the base material 100 may be cut out into a sample having a relatively large size. On the other hand, when a part of the surface S1 has a relatively small radius of curvature, a sample can be prepared by cutting the base material 100 so as to exclude this part.

The small piece of the sample as described above is prepared and may then be subjected to the measurement of the shape of the surface S1, the calculation of the slope of L, and the like, by the same methods as those described above.

If the sample vibrates during measurement, it is difficult to accurately perform the measurement of the shape of the surface S1, and the like. Accordingly, a ground contact surface in the sample, that is, a surface on the side opposite to the surface S1, can be processed so as to have a shape that permits stable placement (for example, a flat surface). This suppresses the vibration of the sample and enables the measurement of the shape of the surface S1, and the like to be performed with high precision.

Hereinabove, the present embodiment has been described in reference to the specific examples. However, the present disclosure is not limited to these specific examples. Embodiments in which suitable design modifications are added to these specific examples by a person skilled in the art are also encompassed in the scope of the present disclosure as long as the features of the present disclosure are provided. Each element and the arrangements, conditions and shapes thereof included in each specific example described earlier are not limited to those given as examples and can be suitably modified. Each element included in each specific example described earlier can suitably have different combinations as long as technical contradictions do not arise.

What is claimed is:

1. A structural member comprising:
   a base material, and
   a protective film covering a surface of the base material, wherein,
   when a section obtained by cutting the base material perpendicularly to the surface thereof is defined as a cross-section,
   a shape of a line corresponding to the surface of the base material in the cross-section is defined as a surface shape, and
   Fourier transformation is performed on a function representing the surface shape, and the transformed function is drawn as a graph with wavelength (μm) on a horizontal axis,
   an average slope of the graph in a range where the wavelength is 30 μm or less is 0.0050 or less.

2. The structural member according to claim 1, wherein a surface roughness of the base material is a roughness with an arithmetic average roughness Ra of more than 0.15 μm.

3. The structural member according to claim 1, wherein the base material is formed of a material containing aluminum oxide.

4. The structural member according to claim 1, wherein the protective film is formed of a material containing yttrium oxide.

5. The structural member according to claim 1, wherein the protective film is formed by an aerosol deposition method.

\* \* \* \* \*